(12) United States Patent
van Meel

(10) Patent No.: US 9,964,620 B2
(45) Date of Patent: May 8, 2018

(54) VISUAL INDICATION OF THE MAGIC ANGLE IN ORTHOPEDIC MRI

(71) Applicant: KONINKLIJKE PHILIPS N.V., Eindhoven (NL)

(72) Inventor: Marius Johannes van Meel, Eindhoven (NL)

(73) Assignee: KONINKLIKE PHILIPS N.V., Eindhoven (NL)

( * ) Notice: Subject to any disclaimer, the term of this patent is extended or adjusted under 35 U.S.C. 154(b) by 245 days.

(21) Appl. No.: 14/421,721

(22) PCT Filed: Aug. 26, 2013

(86) PCT No.: PCT/IB2013/056888
§ 371 (c)(1),
(2) Date: Feb. 13, 2015

(87) PCT Pub. No.: WO2014/033611
PCT Pub. Date: Mar. 6, 2014

(65) Prior Publication Data
US 2015/0204958 A1 Jul. 23, 2015

Related U.S. Application Data

(60) Provisional application No. 61/694,336, filed on Aug. 29, 2012.

(51) Int. Cl.
*G01R 33/56* (2006.01)
*G01R 33/385* (2006.01)
(Continued)

(52) U.S. Cl.
CPC ....... *G01R 33/5608* (2013.01); *G01R 33/385* (2013.01); *G01R 33/56563* (2013.01);
(Continued)

(58) Field of Classification Search
CPC ............ G01R 33/565; G01R 33/56563; G01R 33/5608; G01R 33/385; G06T 11/008; G06T 11/60; G06T 11/203; G06T 2210/41
(Continued)

(56) References Cited

U.S. PATENT DOCUMENTS 7,602,184 B2  10/2009  Du
2008/0116889 A1  5/2008  Hu
(Continued)

FOREIGN PATENT DOCUMENTS

SU          644226 A1    9/1983

OTHER PUBLICATIONS

Rea, Marc et al "Devices to Facilitate Magic Angle Studies in Peripheral MRI", Concepts in Magnetic Resonance Part B: Magnetic Resonance Engineering, vol. 37B, No. 4, Oct. 2010, pp. 220-225.
(Continued)

*Primary Examiner* — Gregory J Tryder
*Assistant Examiner* — Michael Le

(57) ABSTRACT

A magnetic resonance imaging system (10) includes an angle indicator module (36), and a display device (40). The angle indicator module (36) adds at least one visual indicator (1) to an image (46) depicting a magic angle (2) orientation relative to a static magnetic $B_0$ field (4) and the image (46), the image (46) reconstructed from magnetic resonance data received in the $B_0$ field (4). The display device (40) displays (74) the image with the visual indicator. A magic angle is an angle of arccos $(1/\sqrt{3})$ relative to the static magnetic $B_0$ field (4). Moreover, the visual indicator may indicate the likelihood of a magic angle artifact to the operator.

20 Claims, 7 Drawing Sheets

Figure 1:
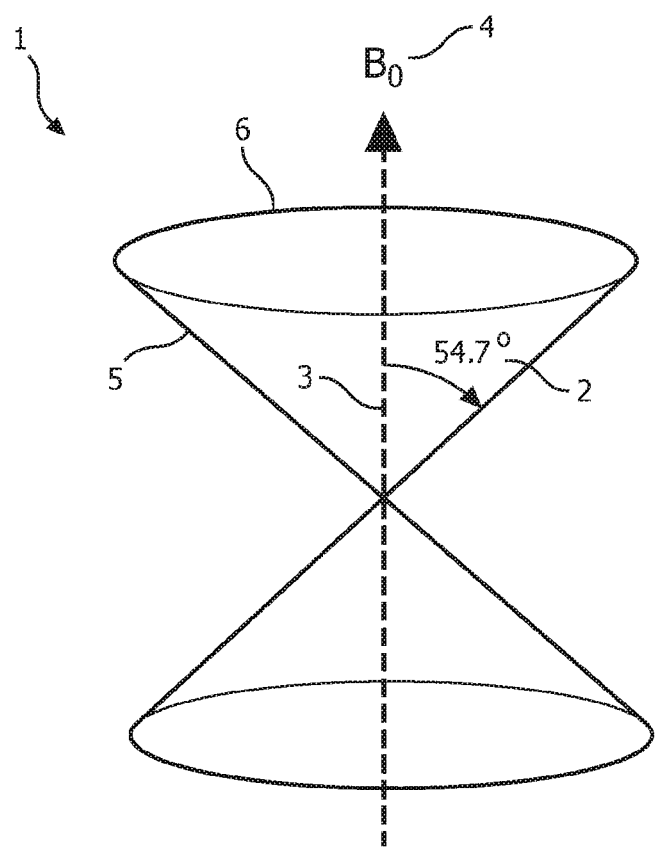

(51) Int. Cl.
G06T 11/20 (2006.01)
G01R 33/565 (2006.01)
G06T 11/60 (2006.01)
G06T 11/00 (2006.01)

(52) U.S. Cl.
CPC .......... *G06T 11/008* (2013.01); *G06T 11/203* (2013.01); *G06T 11/60* (2013.01); *G01R 33/565* (2013.01); *G06T 2210/41* (2013.01)

(58) Field of Classification Search
USPC .......................................................... 345/632
See application file for complete search history.

(56) References Cited

U.S. PATENT DOCUMENTS

| 2011/0044524 | A1* | 2/2011 | Wang ................... G01R 33/54 382/131 |
| 2011/0228995 | A1* | 9/2011 | Batman ................. G06T 19/00 382/128 |
| 2013/0324850 | A1* | 12/2013 | Petruzzelli ............ A61B 8/467 600/443 |

OTHER PUBLICATIONS

Bydder, Mark et al "The Magic Angle Effect: A Source of Artifact, Determinant of Image Contrast, and Technique for Imaging", Journal of Magnetic Resonance Imaging, vol. 25, 2007, pp. 290-300.

"Magic Angle Artefakt" Oct. 2005.

Watanabe, A. et al "Topographic Variation of T2 value in Hip Articular Cartilage at 3T", Proceedings of the International Society for Magnetic Resonance in Medicine, May 2007 pp. 478.

Mountain, K.M. ET "Visualization of Collagen Crimp in Tendon using High-Field MRI" Proceedings International Society Magnetic Resonance in Medicine, vol. 16, 2008, pp. 2541.

Peterfy, Charles et al "Magic-Angle Phenomenon: A Cause of Increased Signal inthe Normal Lateral Meniscus on Short-TE MR Images of the Knee", American Journal Roentgenol, vol. 163, Jan. 1994, pp. 149-154.

Peh, Wilfred C.G. et al "Artifacts in Musculoskeletal Magnetic Resonance Imaging: Identification and Correction", Skeletal Radiology, vol. 30, 2001, pp. 179-191.

Grunder, Wilfried "MRI Assessment of Cartilage Ultrastructure", NMR in Biomedicine, vol. 19, 2006, pp. 855-876.

Spriet, Mathieu et al "Asymmetric Signal Intensity in Normal Collateral Ligaments of the Distal Interphalangeal Joint in Horses with a Low-Field MRI System due to the Magic Angle Effect", Veterinary Radiology & Ultrasound, vol. 48, No, 2, 2007, pp. 95-100.

Smith, Meredith A. et al "Is a Magic Angle Effect Observed in the Collateral Ligaments of the Distal Interphalangeal Joint or the Oblique Sesamoidean Ligaments during Standing Magnetic Resonance Imaging" , Veterinary Radiology & Ultrasound, vol. 49, No. 6, 2008, pp. 509-515.

"Magic Angle" from Wikipedia, Nov. 2011.

* cited by examiner

VISUAL INDICATION OF THE MAGIC ANGLE IN ORTHOPEDIC MRI

CROSS-REFERENCE TO PRIOR APPLICATIONS

This application is the U.S. National Phase application under 35 U.S.C. § 371 of International Application No. PCT/IB2013/056888, filed on Aug. 26, 2013, which claims the benefit of U.S. Provisional Patent Application No. 61/694,336, filed on Aug. 29, 2012. These applications are hereby incorporated by reference herein.

The following relates generally to medical imaging. It finds particular application in conjunction with magnetic resonance imaging (MRI), and will be described with particular reference thereto. However, it will be understood that it also finds application in other usage scenarios and is not necessarily limited to the aforementioned application.

Orthopedic MRI includes imaging of tendons, ligaments, and nerves for disease or damaged tissue which occur in regions of the body such as knees, shoulders, elbows, etc. Tissues of tendons, ligaments, nerves, etc. include highly ordered, collagen-rich tissue containing water bound to the collagen. The protons within the water bound to the collagen are subject to dipolar interactions with a strength dependent upon the orientation of fibers relative to the static magnetic field or $B_0$ field. Strong dipolar interactions usually result in rapid dephasing of the magnetic resonance (MR) signal after excitation such that tissues of tendons, ligaments, nerves, etc. typically produce little or no detectable MR signal. Little or no detectable MR signal appears dark with conventional clinical pulse sequences, i.e. the tissues do not appear in the image. MR imaging sequences are typically configured to display in contrast damaged or diseased tissue. However, a magic angle effect will sometimes increase or decrease the intensity of tissues without regard to the state of disease or damage.

A magic angle effect, at which the dipolar interactions are strongest, occurs at a precisely defined angle between the $B_0$ field and the fiber orientation, and is approximately 54.7°. The magic angle can be visualized as the diagonal of a cube and defined as arccos $$\left(\frac{1}{\sqrt{3}}\right).$$

In magnetic resonance imaging, the magic angle is found relative to the $B_0$ field with dipolar interactions modulated by the term, $3\cos^2\theta-1$. When $\theta$ is the magic angle or approximately 55°, 125°, etc., the dipolar interactions are minimized such that the T2 of the tissues are increased. For example, increases of T2 are reported for an Achilles tendon due to a magic angle effect, such as an increase from 0.6 to 22 msec and 7 to 23 msec. The magic angle in MRI can create an artifact in an image, which include tissues with well-ordered collagen fibers oriented at the magic angle relative to the $B_0$ field. For example, when evaluating the rotator cuff tendons of the shoulder, the magic angle effect can create the appearance of supraspinatus tendinitis.

One method of avoiding the magic angle effect is to increase the echo time (TE) of the pulse sequences used to image tendons and ligaments. For example, an increase in the pulse sequence such as greater than 37 msec resulted in no increase in the signal for the tendon and ligament, but the signal did increase for tissue attributed to disease. The increase in the echo time increases the specificity of the resulting signal, but with a loss in the sensitivity for the disease. Other approaches have tried different changes to imaging sequences such as T1-weighted and ultra-short TE (UTE) sequences. However, UTE sequences are now recognized to have magic angle effects in a wider range of tissues including peripheral nerve, basal layers of articular cartilage, and some forms of fibrocartilage.

Another approach is to recall the patient and image the suspected artifact area at a different angle. However, the approach is an inefficient clinical workflow, and can be limited due to physical constraints of a typical MRI scanner.

Another issue includes the difficulty in segmenting tissues involved and determining the orientation of individual tissue fibers which give rise to the magic angle effect. In interpreting the images, a radiologist will often use operating knowledge of the scanner and sequence with regard to the orientation of the main field to the image to make a mental assessment of a probability of a magic angle effect on various tissue contrasts in the image.

The following discloses a new and improved visual indication of the magic angle in MRI which addresses the above referenced issues, and others.

In accordance with one aspect, a magnetic resonance imaging system includes an angle indicator module, and a display device. The angle indicator module adds at least one visual indicator to an image depicting a magic angle orientation relative to a static magnetic $B_0$ field and the image, the image reconstructed from magnetic resonance data received in the $B_0$ field. The display device displays the image with the visual indicator.

In accordance with another aspect, a method of magnetic resonance imaging includes receiving at least one image reconstructed from magnetic resonance data with a static magnetic $B_0$ field. At least one visual indicator is added to the at least one image depicting a magic angle orientation relative to the $B_0$ field and the image. The image is displayed with the at least one visual indicator on a display device.

In accordance with another aspect, a magnetic resonance imaging system includes one or more processors and a display device. The one or more processors are configured to receive an image reconstructed from magnetic resonance data in a static magnetic $B_0$ field, and add at least one visual indicator to the image which depicts a magic angle orientation relative to the $B_0$ field and the image. The display device displays the image with the at least one visual indicator.

One advantage is better interpretations of MR images which may contain magic angle artifacts.

Another advantage resides in easier identification of magic angle artifacts.

Another advantage resides in clear identification of a magic angle in images.

Another advantage resides in facilitating clinical workflow which involves magnetic resonance images with tissues likely to produce magic angle artifacts.

Still further advantages will be appreciated to those of ordinary skill in the art upon reading and understanding the following detailed description.

The invention may take form in various components and arrangements of components, and in various steps and arrangement of steps. The drawings are only for purposes of illustrating the preferred embodiments and are not to be construed as limiting the invention.

FIG. 1 diagrammatically illustrates an embodiment of a visual indicator of a magic angle in MRI.

Figure 2:
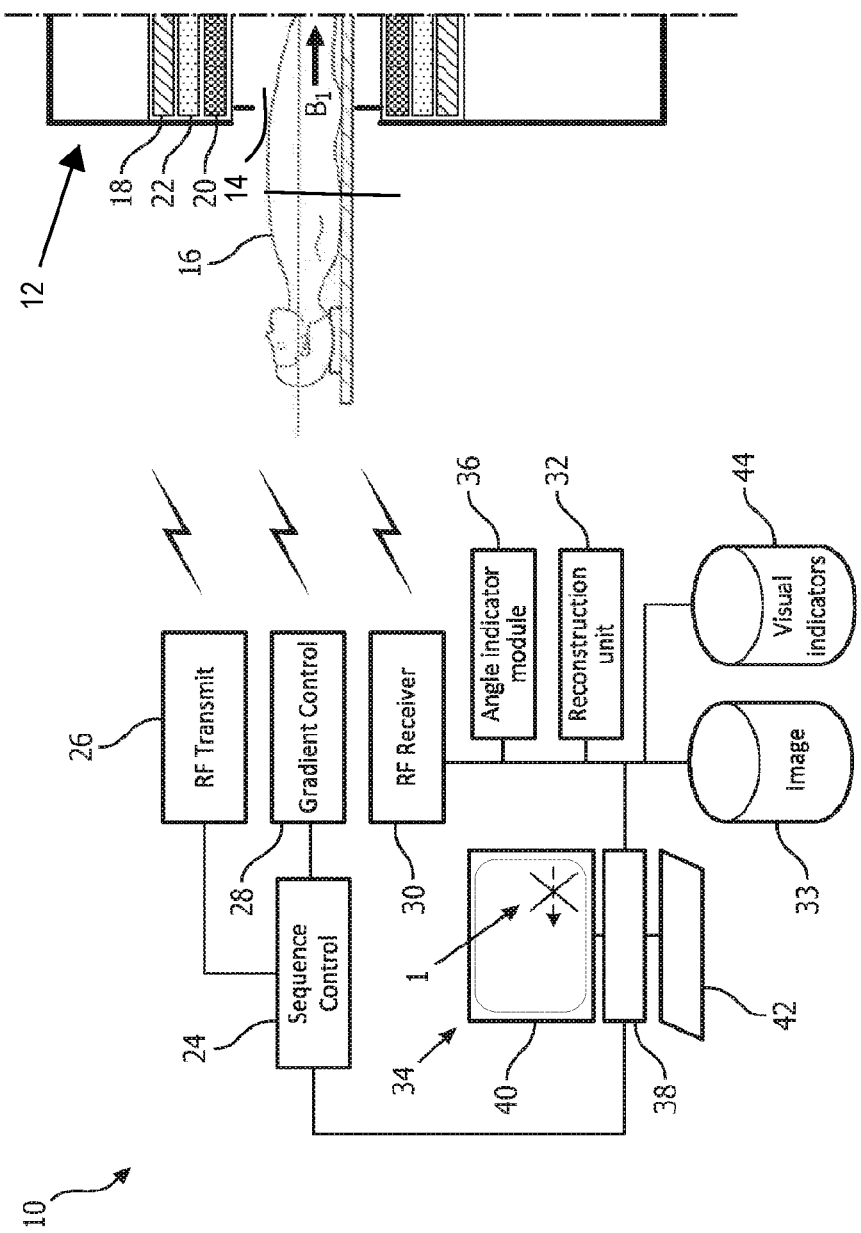

FIG. 2 schematically illustrates one embodiment of an MRI system with a visual indicator of the magic angle.

FIG. 3-6 depicts an exemplary image with a magic angle artifact and embodiments of the visual indicator.

Figure 7:
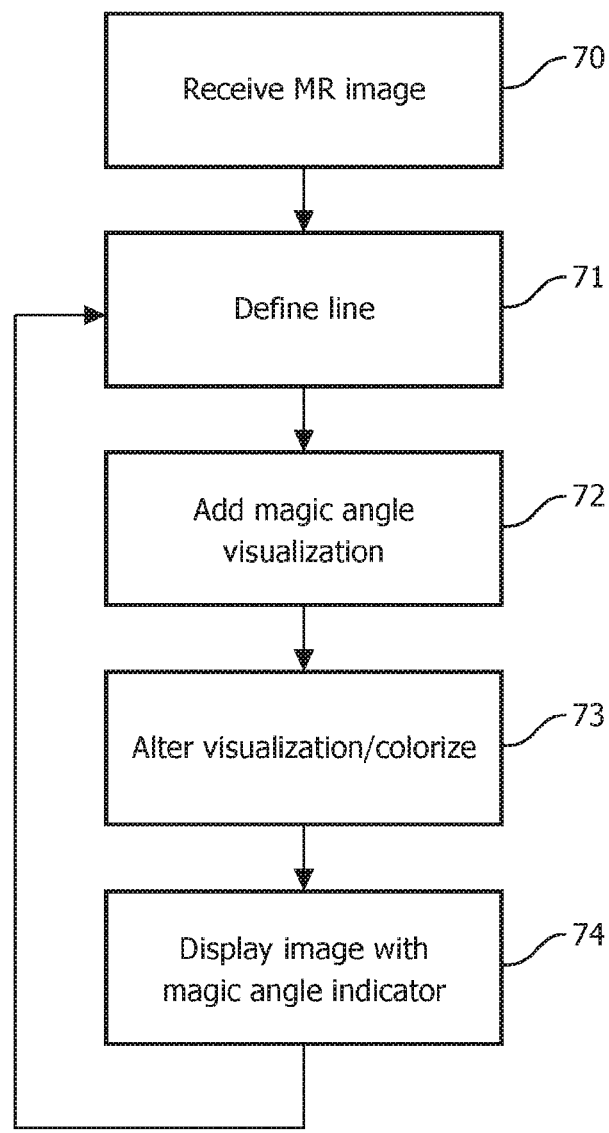

FIG. 7 flowcharts one method of using an embodiment of a MRI system with the magic angle indicator.

With reference to FIG. 1, an embodiment of a visual indicator 1 of a magic angle 2 in MRI is diagrammatically illustrated. The visual indicator includes a geometric and/or numerical display in 2 dimensions. The visual indicator can be used for 2 dimensional images such as image slices or 3 dimensional images such as a volume with a viewport into the volume. The visual indicator includes a directional identification 3 of the static magnetic field or $B_0$ field 4 such as line. The line can include an arrowhead, be dotted, colored, shaded, etc. The visual indicator includes a visual identification 5 of the magic angle 2 such as one or more lines which identify the magic angle relative to the $B_0$ field 4. A geometric object 6 such as an ellipse can be used when the angle of the $B_0$ field is not within the plane of the image to indicate in a 2 dimensional display an angle relative to the image plane.

FIG. 2 schematically illustrates one embodiment of an MRI system 10 with a visual indicator 1 of the magic angle. The system 10 includes a MR scanner 12 such as an open system or c-type scanner, a horizontal bore scanner, and the like shown in a cross section view. The scanner includes an opening or bore 14 that defines an examination region in which a subject 16 is placed for a spectroscopic and/or imaging examination. The MR scanner 12 includes one or more main magnets 18 with a C-shape ferrous flux return path, one or more radio frequency (RF) coils 20, and one or more gradient coils 22. The C-type main magnet 18 generates a vertical static $B_0$ field 4 such as vertical static field. Alternatively, a bore main magnet can generate a horizontal static field.

The system 10 includes a sequence controller 24 which controls the operation of the imaging sequence, a RF transmitter unit 26 controlling the operation of the RF coils 20, and a gradient controller 28 controlling the operation of the gradient coils 22. The communication between the controlling unit and the corresponding coils can be wireless or wired. The RF coils 20 generate radio frequency pulses which excite and manipulate resonance in tissue of the subject 16. The RF coils 20 can include a whole body coil and/or a local coil 21 such as a torso coil, hand coil, shoulder coil, knee coil, etc. The one or more gradient coils 22 generate gradient magnetic fields across the static magnetic field to spatially encode the induced resonance, induced gradient echoes, and the like. The sequence controller 24 configures the RF coils and the gradient coils to excite and manipulate resonance in tissues of the subject.

The system 10 includes a RF receiver unit 30, which receives MR signals. As the resonance decays in the tissue of the subject, weak radio frequency signals or MR signals are received by a radio frequency antenna such as the RF coils 20 and transmitted to the RF receiver unit 30. A reconstruction unit 32, such as a processor, receives RF data or MR signals from the RF receiver 28 and reconstructs one or more images from the received MR data such as image slices, a volume, etc. The reconstructed images can be stored in a memory 33 such as a non-transitory memory. Non-transitory memory can include local disk storage, cloud storage, and/or a storage management system such a Picture Archiving and Communication System (PACS), a Radiology Information System (RIS), and the like.

The system includes a workstation 34, which includes the user interface and the angle indicator module 36. The workstation 34 includes an electronic processor or electronic processing device 38, a display device 40 which displays the reconstructed images, the visual indicator 1, menus, panels, and user controls, and at least one input device 42 which inputs the healthcare practitioner selections. The workstation 34 can be a desktop computer, a laptop, a tablet, a mobile computing device, a smartphone, and the like. The display device 40 can include a computer monitor, a touch screen, Cathode ray tube (CRT), Storage tube, Flat panel display, Light-emitting diode (LED) displays, Electroluminescent display (ELD), Plasma display panels (PDP), Liquid crystal display (LCD), Organic light-emitting diode displays (OLED), a projector, and the like. The input device 42 can be a keyboard, a mouse, a microphone, and the like.

The reconstructed image is received from the memory 33 and the angle indicator module 36 adds the visual indicator 1. The image and the visual indicator are displayed on the display device 40. The angle indicator module can retrieve representations of the visual indicator 1 stored as objects in a memory 44 or can dynamically construct the visual indicator from routines such as line drawing routines, graphic routines, display routines, etc. The visual indicator 1 can be customized to a locality or system. The healthcare practitioner can interact with the system through the user interface of the workstation 34 and the angle indicator module can interpret and process the interactions in the context of possible magic angle artifacts. For example, the visual indicator 1 can be modified based on an angle of a displayed slice other image relative to $B_0$, the likelihood of a magic angle artifact, and/or the healthcare practitioner input of locations in an image which may contain a possible magic angle artifact.

The various units, modules or controllers 24, 26, 28, 30, 32, 36 are suitably embodied by an electronic data processing device, such as the electronic processor or electronic processing device 38 of the workstation 34, or by a network-based server computer operatively connected with the workstation 34 by a network, or so forth. Moreover, the disclosed visualization and reconstruction techniques are suitably implemented as a non-transitory storage medium storing instructions (e.g., software) readable by an electronic data processing device and executable by the electronic data processing device to perform the disclosed reconstruction and visualization techniques.

Figure 3:
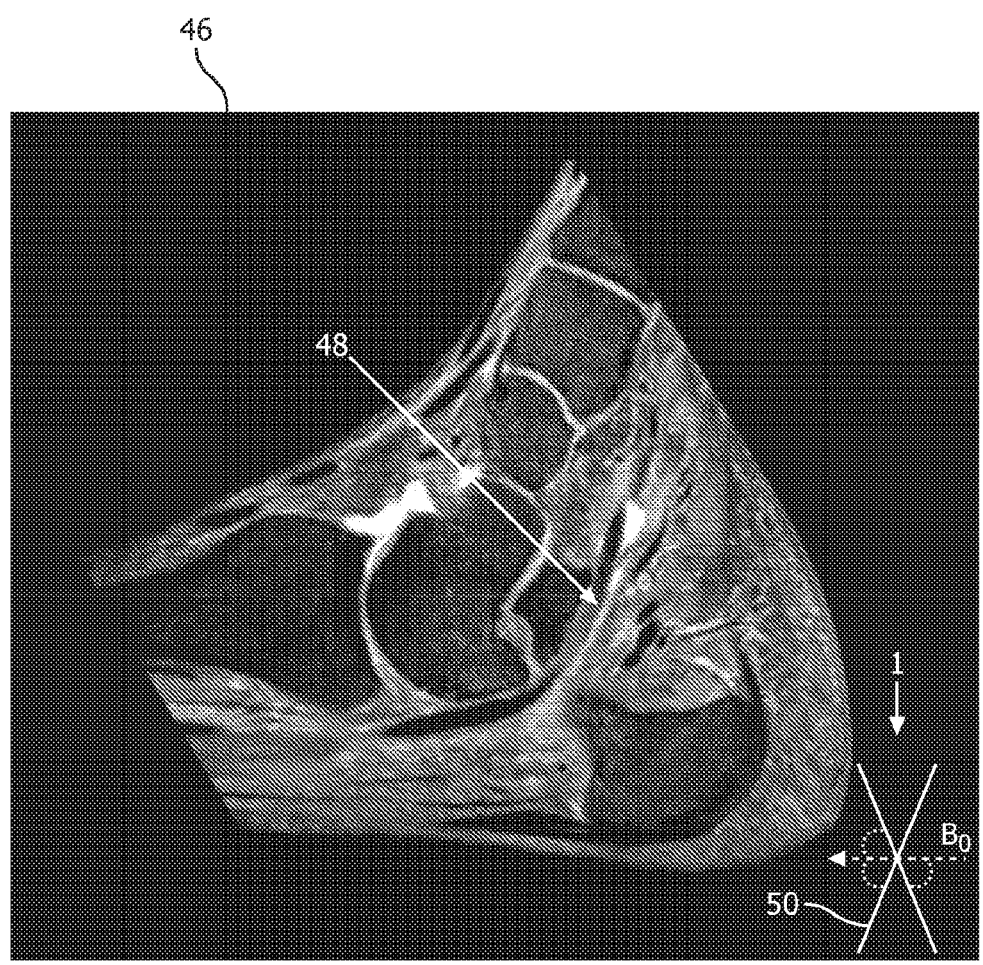

With reference to FIG. 3 an exemplary image 46 with a magic angle artifact 48 and an embodiment of the visual indicator 1 is depicted. The exemplary image is an image slice of an ankle which includes tendons and ligaments. The bright area of the image oriented parallel to the line 50 of the visual indicator 1 represents a magic angle artifact 48. In this embodiment, the visual indicator is added as a reference to the image. For example, the visual indicator is located in an area of the image display which does not overlay the content of the image, but provides reference to the healthcare practitioner as to the orientation of the static magnetic field and the magic angle orientation relative to the $B_0$ field and the image. In one embodiment, the visual indicator 1 can be displayed or not displayed by a command received from the healthcare practitioner using the input device 42.

Figure 4:
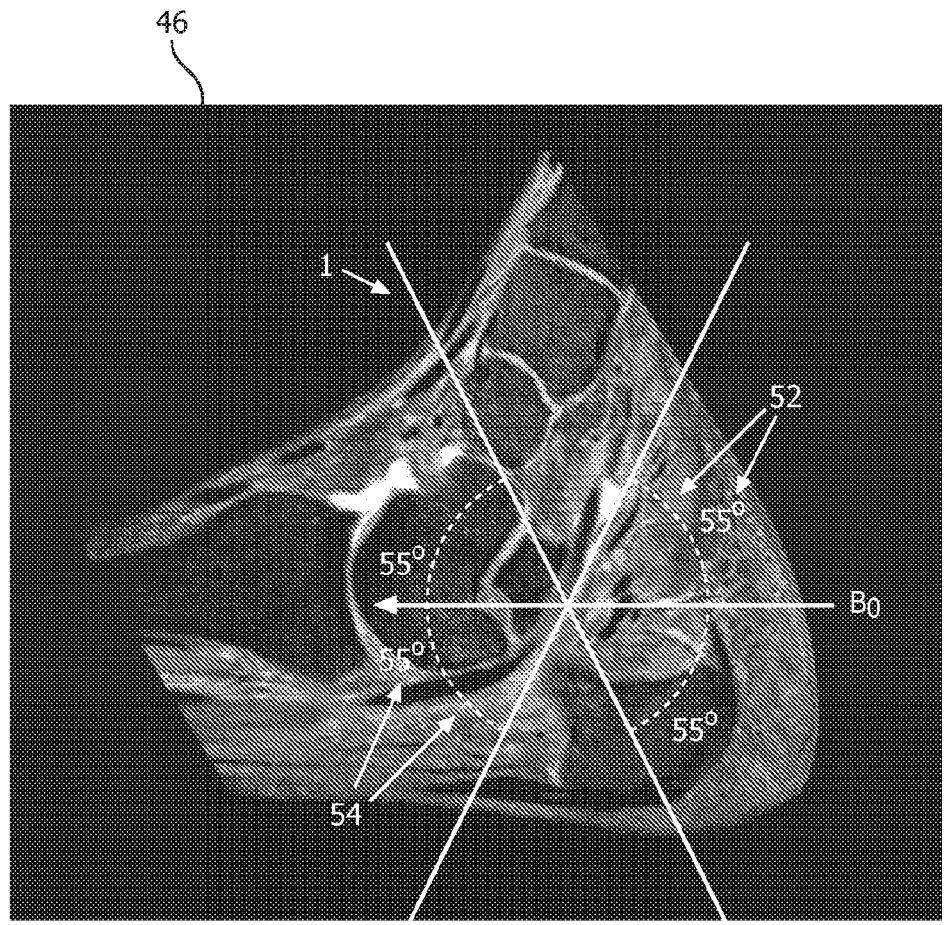

In FIG. 4 the exemplary image 46 is depicted with another embodiment of the visual indicator 1. The visual indicator 1 is re-locatable and/or re-sizeable. The healthcare practitioner using the input device 42 such as a mouse can move and/or resize the visual indicator relative to the image 46 using techniques such as drag and drop. The visual indicator 1 can include numerical displays such as the 55° notation for the approximation of the magic angle. A dotted line can be included with the numerical display to further enhance the visual understanding of the magic angle. By sizing and placing the visual indicator, a healthcare practitioner can visualize the magic angle relative to possible artifacts within the image.

The angle indicator module 36 can determine a likelihood of a magic angle artifact. For example, a gradient image or using the highest intensity values of image pixels can be used as input to techniques such as a least squares regression which fits a line to the pixel values and determines a likelihood of magic angle artifact. The fitted line is based on a line representing the magic angle relative to the $B_0$ field.

The angle indicator module 36 can alter the appearance of the visual indicator 1 based on the determination or likelihood of a magic angle artifact. The appearance can be alter by color, size, shape, presence/absence, and/or intensity of the visual indicator components. For example, as shown in FIG. 4, portions of the visual indicator 1 which indicate a possible magic angle artifact 52 are changed in appearance such as color to indicate the possible presence of the magic angle artifact. Colors such as red provide contrast between the image and the visual indicator for reference by the healthcare practitioner. Other portions of the visual indicator 1 which do not indicate a likelihood of the magic angle artifact 52 can be left unaltered or altered to a less contrasting appearance. Colors such as black/white, green, or gold can contrast with the image for understanding while not indicating a likelihood of an artifact. The change in appearance of the visual indicator can indicate a localization of the likelihood based on the location of the visual indicator or include the whole image or image slice. For example, the quadrant represented with the visual indicator which includes crossed lines can be altered to indicate the possible presence of an artifact in that quadrant, or a portion of the line altered to indicator a localized area of the image pertaining to the artifact. In another embodiment, the color can change as the visual indicator is dragged around the image to indicate probability at its current location.

Figure 5:
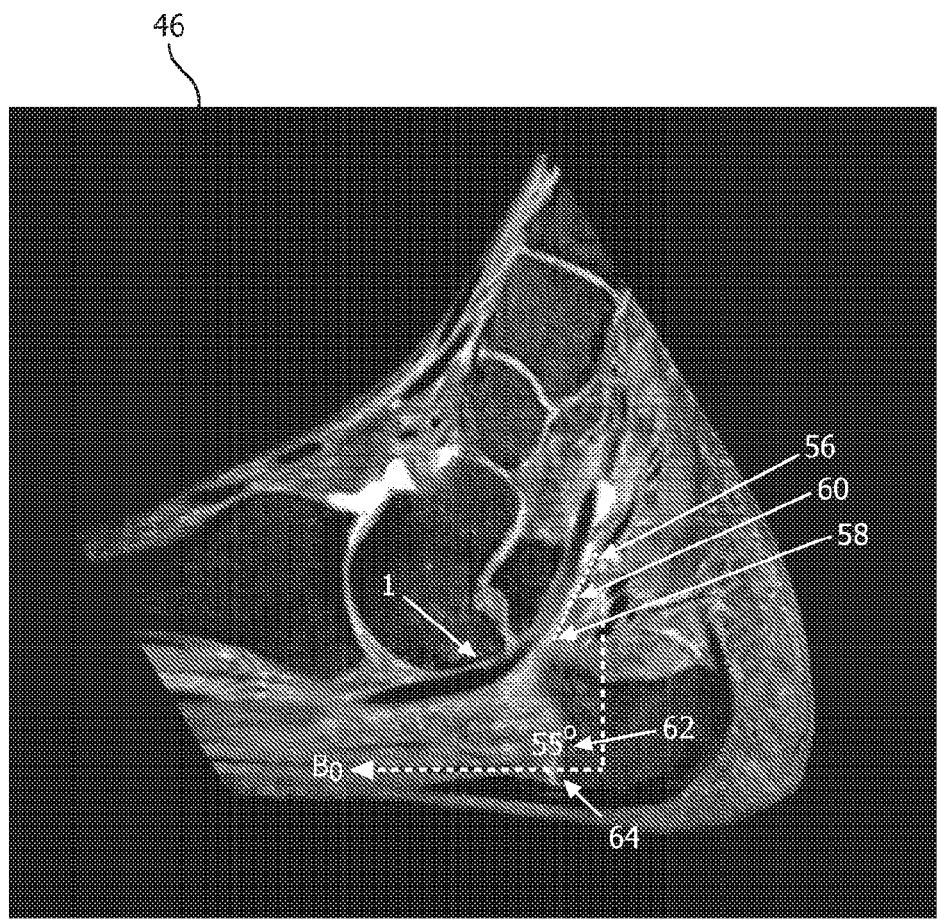

With reference to FIG. 5, an exemplary image 46 with the magic angle artifact and an embodiment of the visual indicator 1 is shown. A healthcare practitioner can interact with the angle indicator module 36 by indicating end points 56, 58 of a line 60 representing a possible magic angle artifact. The healthcare practitioner can select the end points 56, 58 with the input device 42 such as depressing the mouse button to select one end point and dragging the mouse to another end point and releasing the button to select the other end point to draw a line. A line is denoted by the selected end points and can be visualized by a line, dotted line, etc. The end points of the line can be moveable by the healthcare practitioner.

The angle indicator module 36 can determine the likelihood of a magic angle by computing the angle of the line relative to the direction of the $B_0$ field in the image. The visual indicator indicates the direction of the $B_0$ field in the image 64. The angle indicator module can display the angle of the line 62 which is this instance is 55°. The angle indicator module can alter the display of the visual indicator 1 to indicate the likelihood of a magic angle artifact such as changing the color of the numerical display 62 of the angle and the color of the line 60 drawn by the healthcare practitioner. For example, when a tendon appears to be discontinuous, the practitioner marks two or more points on a visible portion of the tendon or draws a line or curve along the path to be queried. A connecting path between the apparent end points is colorized to indicate the probability of a magic angle artifact along the line.

Figure 6:
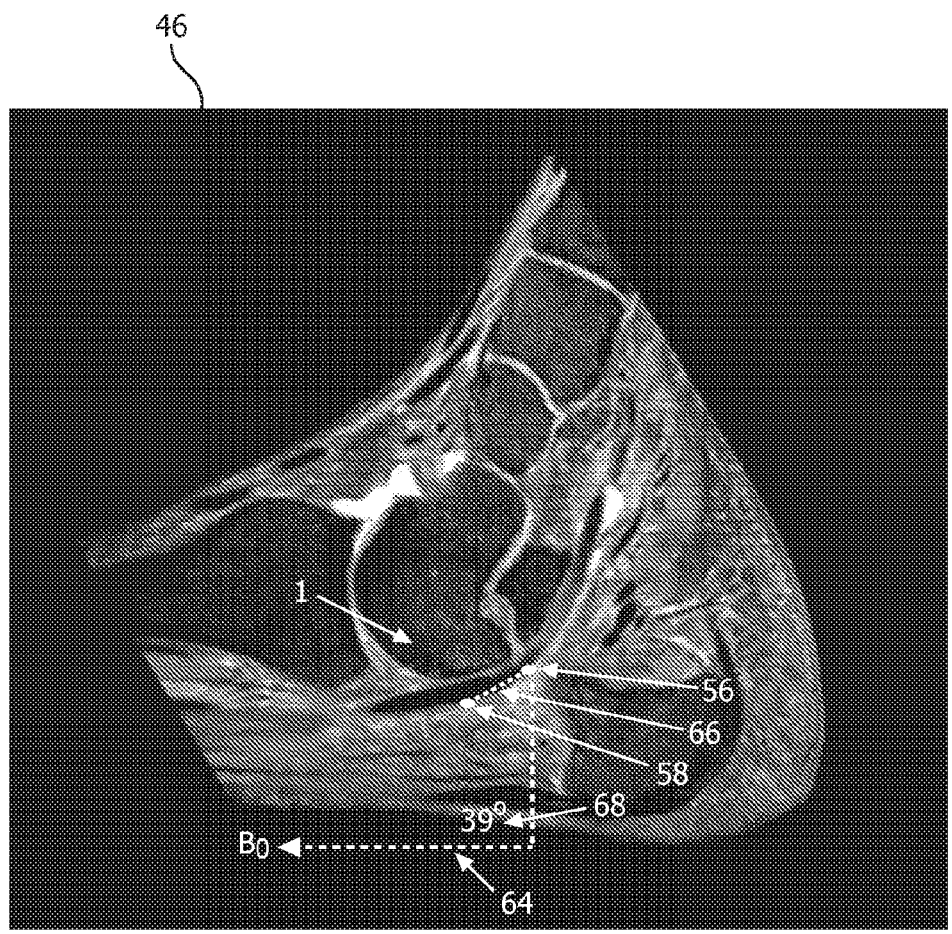

With reference to FIG. 6 the exemplary image 46 with a magic angle artifact and an embodiment of the visual indicator 1 is shown. Similar to FIG. 5, the healthcare practitioner indicates two end points 56, 58 which define a line 66 or draws a line. The line can represent a possible artifact. The angle indicator module 36 makes a determination of the likelihood of a magic angle based on the line 66. The angle indicator module can alter the appearance of the visual indicator 1 such as computing the actual of the line which in this instance is 39° and displaying the actual angle 68 as part of the visual indicator. The angle indicator module can alter the appearance based on the determination of the likelihood of a magic angle with the user drawn line 66. In this instance, the color of the line 66 and the color of the displayed angle 68 are altered to a green color to indicate that a magic angle is not likely.

FIG. 7 flowcharts one method of using an embodiment of a MRI system 10 with the magic angle visual indicator 1. In a step 70, the image 46 reconstructed from MR data with a static magnetic field $B_0$ is received. The image can be received or retrieved from memory 33 directly after completion by a reconstruction processor or from non-transitory memory such as a PACS, RIS, and the like. The orientation of the $B_0$ can be determined from either the reconstruction unit or from the meta-data associated with the image such as the Digital Imaging and Communications in Medicine (DICOM) standard header information.

In an optional step 71 or an alternative embodiment, the healthcare practitioner defines a line by indicating end points using the input device 42. The line can be defined by two end points. The line can be multiple contiguous lines such as the end point of one line being the starting point of the next line. The line can include drawing arcs and non-straight lines with the input device 42 such as tracing the edge of a tendon with a click and drag of a computer mouse.

The visual indicator 1 is added in a step 72. The visual indicator can be added as a reference as depicted and discussed in reference to FIG. 2 and be added to each displayed slice of an image volume. The visual indicator can be re-locatable and/or re-sizeable as depicted and discussed in reference to FIG. 3. The visual indicator can be interactive as depicted and discussed in reference to FIGS. 3-6. The visual indicator can include a visual representation of a likelihood of a magic angle artifact based on image analysis and/or healthcare practitioner input.

In an optional step 73 or an alternative embodiment, the likelihood can be represented by altering the appearance of the visual indicator or portions thereof. The visual indicator can include numerical displays of the magic angle, the measured angle indicated by a healthcare practitioner defined line. The alteration of the visual indicator can indicate a likelihood of a magic angle artifact such as a change in color, shape, presence/absence of a portion, a numerical display, text message, and the like. The alteration of the visual indicator can indicate a localization of the possible magic angle artifact such as altering the line defined by the healthcare practitioner or a portion of the visual indicator 1.

The display device 40 displays the image 46 and the visual indicator 1 in a step 74. The steps can be interactive and repeatable based on the embodiment and input by the healthcare practitioner. For example, the image can be displayed without the visual indicator and with the input device 42 such an entered keyboard command add the visual indicator 1 to the display. In other embodiments interaction through the input device can include relocating and/or resizing the visual indicator after an initial display. In yet other embodiments, the visual indicator can be an interactive component of the display such as the healthcare practitioner defining a line with two points and the angle indicator module making a determination of the likelihood of a magic angle artifact and indicating a result of that determination on the display.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. A magnetic resonance imaging system, comprising:
an angle indicator module which adds at least one visual indicator to an image depicting a magic angle orientation relative to a static magnetic $B_0$ field in the image, the image being reconstructed from magnetic resonance data received in the $B_0$ field; and
a display device which displays the image with the visual indicator.

2. The system according to claim 1, wherein the at least one visual indicator includes at least one of a geometric shape and a numerical representation.

3. The system according to claim 1, wherein the at least one visual indicator is resizable and/or re-locatable in response to input from a user of the magnetic resonance imaging system.

4. The system according to claim 1, wherein the at least one visual indicator includes an indication of the likelihood of a magic angle artifact.

5. The system according to claim 1, wherein the indication of the likelihood of a magic angle artifact includes at least one of a color of the visual indicator and a numerical display.

6. The system according to claim 5, further including:
at least one input device with which a healthcare practitioner indicates at least two points of a line; and
wherein the at least one visual indicator indicates the likelihood of magic angle artifacts along the line.

7. The system according to claim 6, further comprising a memory configured to store at least one representation of the at least one visual indicator, wherein the angle indicator module retrieves a representation of the at least one visual indicator from the memory for adding the at least one visual indicator to the image.

8. The system according to claim 7, wherein the at least one visual indicator defines an angle of arccos $$\left(\frac{1}{\sqrt{3}}\right)$$

relative to the $B_0$ field.

9. The system according to claim 1, wherein the at least one visual indicator includes at least one of a line and an ellipse.

10. The system according to claim 9, wherein the at least one visual indicator includes:
a dotted line with an arrow which indicates the direction of the $B_0$ field; and
two lines which cross the arrow at the same point and at an angle of arccos $$\left(\frac{1}{\sqrt{3}}\right)$$

relative to the dotted line.

11. A method of magnetic resonance imaging, comprising:
receiving at least one image reconstructed from magnetic resonance data with a static magnetic $B_0$ field;
adding at least one visual indicator to the at least one image using one or more electronic data processing devices, the at least one visual indicator depicting a magic angle orientation relative to the $B_0$ field in the image; and
displaying the image with the at least one visual indicator on a display device.

12. The method according to claim 11, further including:
resizing and/or relocating the at least one visual indicator in response to input from a user of a magnetic resonance imaging system.

13. The method according to claim 11, wherein the at least one visual indicator includes an indication of the likelihood of a magic angle artifact.

14. The method according to claim 11, further including:
receiving via at least one input device a user input indicating at least two points of a line on the display device; and
altering the at least one visual indicator by at least one of color, shape, and numerical display to correspond with the likelihood that the line approximates a magic angle.

15. The method according to claim 14, wherein the at least one visual indicator is included in each displayed image slice.

16. The method according to claim 15, further including:
altering a portion of the at least one visual indicator to indicate a localization of the likelihood of a magic angle artifact.

17. The method according to claim 15, wherein the at least one visual indicator includes at least one of a line and an ellipse.

18. A non-transitory computer-readable storage medium carrying software which controls the one or more electronic data processing devices to perform the method according to claim 11.

19. An electronic data processing device configured to perform the method according to claim 11.

20. A magnetic resonance imaging system, comprising:
one or more processors configured to:
receive an image reconstructed from magnetic resonance data in a static magnetic $B_0$ field, and
add at least one visual indicator to the image which depicts an angle of arccos $$\left(\frac{1}{\sqrt{3}}\right)$$

relative to the $B_0$ field; and
a display device which displays the image with the at least one visual indicator.

* * * * *